United States Patent
Sakakibara

(10) Patent No.: US 8,823,574 B2
(45) Date of Patent: Sep. 2, 2014

(54) SUCCESSIVE APPROXIMATION TYPE A/D CONVERTER, METHOD OF CONTROLLING SUCCESSIVE APPROXIMATION TYPE A/D CONVERTER, SOLID-STATE IMAGING DEVICE, AND IMAGING APPARATUS

(75) Inventor: Masaki Sakakibara, Kanagawa (JP)

(73) Assignee: Sony Corporation (JP)

( * ) Notice: Subject to any disclaimer, the term of this patent is extended or adjusted under 35 U.S.C. 154(b) by 290 days.

(21) Appl. No.: 13/222,062

(22) Filed: Aug. 31, 2011

(65) Prior Publication Data

US 2011/0309963 A1 Dec. 22, 2011

Related U.S. Application Data

(63) Continuation of application No. 12/552,482, filed on Sep. 2, 2009, now Pat. No. 8,022,856.

(30) Foreign Application Priority Data

Sep. 8, 2008 (JP) ................................. 2008-229360

(51) Int. Cl.
*H03M 1/06* (2006.01)
*H03M 1/40* (2006.01)
*H03M 1/46* (2006.01)

(52) U.S. Cl.
CPC ................ *H03M 1/462* (2013.01); *H03M 1/40* (2013.01); *H03M 1/066* (2013.01); *H03M 1/0675* (2013.01)
USPC ........................................................ 341/162

(58) Field of Classification Search
USPC .......................................... 341/161, 162, 163
See application file for complete search history.

(56) References Cited

U.S. PATENT DOCUMENTS

| | | | |
|---|---|---|---|
| 5,880,691 A * | 3/1999 | Fossum et al. | 341/162 |
| 5,929,800 A | 7/1999 | Zhou et al. | |
| 6,181,268 B1 * | 1/2001 | Miyake et al. | 341/161 |
| 6,232,903 B1 | 5/2001 | Koifman et al. | |
| 7,609,185 B2 | 10/2009 | Kernahan et al. | |
| 2002/0003487 A1 | 1/2002 | Harada et al. | |
| 2003/0052809 A1 * | 3/2003 | Kuttner | 341/162 |
| 2004/0051657 A1 | 3/2004 | Jonsson et al. | |
| 2007/0001892 A1 | 1/2007 | Kuttner | |
| 2008/0198056 A1 | 8/2008 | Hurrell | |

FOREIGN PATENT DOCUMENTS

| | | |
|---|---|---|
| JP | 02-176519 | 7/1990 |
| JP | 03-008074 | 1/1991 |

(Continued)

OTHER PUBLICATIONS

Radulov et al.; A Binary-to-Thermometer Decoder with Built-in Redundancy for Improved DAC Yield; IEEE; 2006 Proceedings IEEE International Symposium on Circuits and Systems; Sep. 2006; pp. 1414-1417.

*Primary Examiner* — Howard Williams
(74) *Attorney, Agent, or Firm* — Sheridan Ross P.C.

(57) ABSTRACT

A successive approximation type A/D converter includes: a reference signal generating section generating a reference signal; a comparator comparing an analog signal input thereto with the reference signal and converting the analog signal into a digital signal; and a control section controlling the reference signal to perform oversampling by executing an A/D conversion process on the analog signal at the comparator plural times such that the analog signal is A/D-converted into a digital value of N bits at the first A/D conversion process and such that the second and subsequent A/D conversion processes are performed starting with a lower bit of the (N−n)-th or lower order with upper n bits of the N-bit digital value obtained at the first A/D conversion process fixed.

9 Claims, 12 Drawing Sheets

(56) References Cited

FOREIGN PATENT DOCUMENTS

| JP | 04-103729 | 4/1992 |
| JP | 05-343998 | 6/1992 |
| JP | 05-055919 | 3/1993 |
| JP | 10-209870 | 8/1998 |
| JP | 11-154866 | 6/1999 |
| JP | 2006-108893 | 4/2006 |

* cited by examiner

Mode2

Mode1

Mode1

Mode2

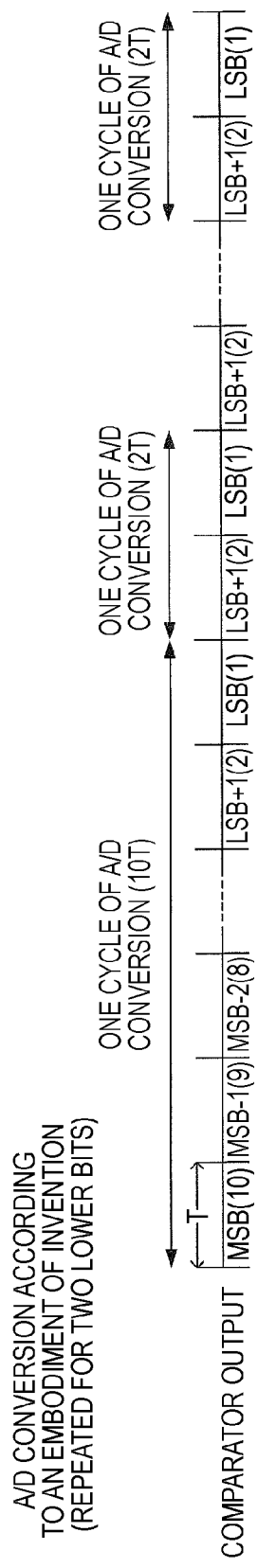

NON-REDUNDANT CONFIGURATION

REDUNDANT CONFIGURATION

SUCCESSIVE APPROXIMATION TYPE A/D CONVERTER, METHOD OF CONTROLLING SUCCESSIVE APPROXIMATION TYPE A/D CONVERTER, SOLID-STATE IMAGING DEVICE, AND IMAGING APPARATUS

RELATED APPLICATION DATA

This application is a continuation of U.S. patent application Ser. No. 12/552,482, filed Sep. 2, 2009, the entirety of which is incorporated herein by reference to the extent permitted by law. The present application claims priority to Japanese Patent Application No. 2008-229360 filed in the Japan Patent Office on Sep. 8, 2008, the entirety of which also is incorporated by reference herein to the extent permitted by law.

BACKGROUND OF THE INVENTION

The present invention relates to a successive approximation type A/D converter, a method of controlling a successive approximation type A/D converter, a solid-state imaging device, and an imaging apparatus.

There is a type of A/D converters called successive approximation type A/D converters. In a successive approximation type A/D converter, comparison of magnitudes is repeated many times by a single comparator. More specifically, a voltage having amplitude that is one half of maximum amplitude (full scale; FS) is compared with an input voltage. The result of comparison obtained at this time corresponds to the most significant bit (MSB) of a digital value.

According to the value of the most significant bit, another comparison is subsequently carried out between the input voltage and a voltage FS/4 or 3FS/4 higher or lower than the first voltage by amplitude that is one half of the amplitude of the first voltage, i.e., amplitude equivalent to ¼FS. The result of comparison at this time constitutes the value of the next bit. The same step is repeated thereafter, and an A/D conversion process is completed by executing the step N times.

Known techniques for reducing the conversion time of a successive approximation A/D converter of this type include a technique involving the step of detecting upper bits which have been obtained at the same values at all of i cycles of preceding A/D conversion (i≥2) and applying the fixed values of those bits to the current cycle of successive approximation (for example, see JP-A-2006-108893 (Patent Document 1)).

SUMMARY OF THE INVENTION

In a successive approximation type A/D converter, noise components included in an input signal can be reduced through averaging based on oversampling. Oversampling is an operation of obtaining plural pieces of digital data by executing an A/D conversion process a plurality of times where the conversion process involves a step that is repeated N times to complete the process. Averaging is an operation of obtaining an average from the sum of plural pieces of data obtained through oversampling. When n pieces of data are summed up, the total amount of signal components will be n times the amount per piece of data, and the total amount of noise components will be √n times the amount per piece of data. Thus, an improved signal-to-noise ratio can be achieved by averaging the amounts of those components.

Let us now discuss about a common A/D conversion operation performed by a successive approximation type A/D converter, the operation involving A/D conversion of N bits and oversampling performed M times. For example, let us assume that 10 bits (N=10) are A/D-converted and that oversampling is performed four times (M=4). Then, as shown in FIG. 13, an A/D conversion process having ten cycles is performed to process 1 bit per cycle (period T). Subsequently, the A/D conversion process is repeated four times to process the same 10 bits as the first operation at ten cycles of the process.

As thus described, in a common successive approximation type A/D converter according to the related art, comparison must be carried out N times at an A/D conversion process of N bits. Thus, the comparing operation must be performed N×(M+1) times when oversampling of an input signal is performed M times, and the A/D conversion therefore takes a long time. The technique for reducing conversion time disclosed in Patent Document 1 is not based on the supposition that averaging through oversampling will be carried out. That is, when the technique for reducing conversion time disclosed in Patent document 1 is applied to averaging through oversampling as it is, the technique will not allow any reduction of the time required for the process involving oversampling and will therefore allow no reduction of time required for A/D conversion.

Under the circumstance, it is desirable to provide a successive approximation type A/D converter in which time required for a process involving oversampling can be reduced to reduce time required for A/D conversion consequently, a method of controlling such a successive approximation type A/D converter, and a solid-state imaging device and an imaging apparatus having such a converter.

An embodiment of the invention is directed to a successive approximation type A/D converter having a reference signal generating section generating a reference signal and a comparator comparing an analog signal input thereto with the reference signal and converting the analog signal into a digital signal, wherein the reference signal is controlled to perform oversampling by executing an A/D conversion process on the analog signal at the comparator plural times such that the analog signal is A/D-converted into a digital value of N bits at the first A/D conversion process and such that the second and subsequent A/D conversion processes are performed on lower bits starting with the (N−n)-th bit with upper n bits of the N-bit digital value obtained at the first A/D conversion process fixed.

When the successive approximation type A/D converter having the above-described configuration performs oversampling by executing the A/D conversion process plural times, a digital value of N bits is obtained from an analog signal at the first A/D conversion process. The A/D conversion at this time is a common A/D conversion process in which a step is repeated N times to perform A/D conversion. Oversampling is performed at the second and subsequent A/D conversion processes. When there is a high degree of correlation between the states of the analog signal when input for the first A/D conversion and when input for the second and subsequent A/D conversion processes, the digital values of the upper n bits will not change.

In consideration to this fact, at the second and subsequent A/D conversion processes, no A/D conversion is performed on the upper n bits of the digital value having N bits obtained at the first A/D conversion process to leave those bits fixed, and A/D conversion is started from the (N−n)-th bit that is a lower bit. The number n of the upper bits having unchanging digital values becomes greater, the higher the degree of correlation between the states of the analog signal when input for the first A/D conversion process and when input for the second and subsequent A/D conversion processes. Then, the second and subsequent A/D conversion processes are started at a lower bit.

As thus described, the second and subsequent A/D conversion processes are started at a lower bit of the (N−n)-th or lower order, or started in the middle of the bit string. Thus, no processing is required for the group of bits from the most significant bit up to the bit preceding the bit at which the second and subsequent A/D conversion processes are started. The processing time can be reduced accordingly. Let us assume that the time reduced per cycle of the oversampling process is represented by T and that oversampling is performed M times. Then, the processing time that can be reduced at the entire oversampling process is T×M. That is, the processing time required to perform oversampling M times can be reduced by an amount of time of T×M when compared to the processing time required when the method according to the embodiment is not used.

According to the embodiment of the invention, the second and subsequent A/D conversion processes involved in oversampling can be performed with upper n bits fixed, and processing time can be reduced by an amount of time that is otherwise required for A/D conversion of the n bits. Thus, time required for A/D conversion can be reduced.

BRIEF DESCRIPTION OF THE DRAWINGS

FIG. 7 is a diagram showing a processing sequence for an instance wherein the successive approximation type A/D converter according to the embodiment of the invention has a return value of 2 bits;

DESCRIPTION OF THE PREFERRED EMBODIMENT

Figure 1:
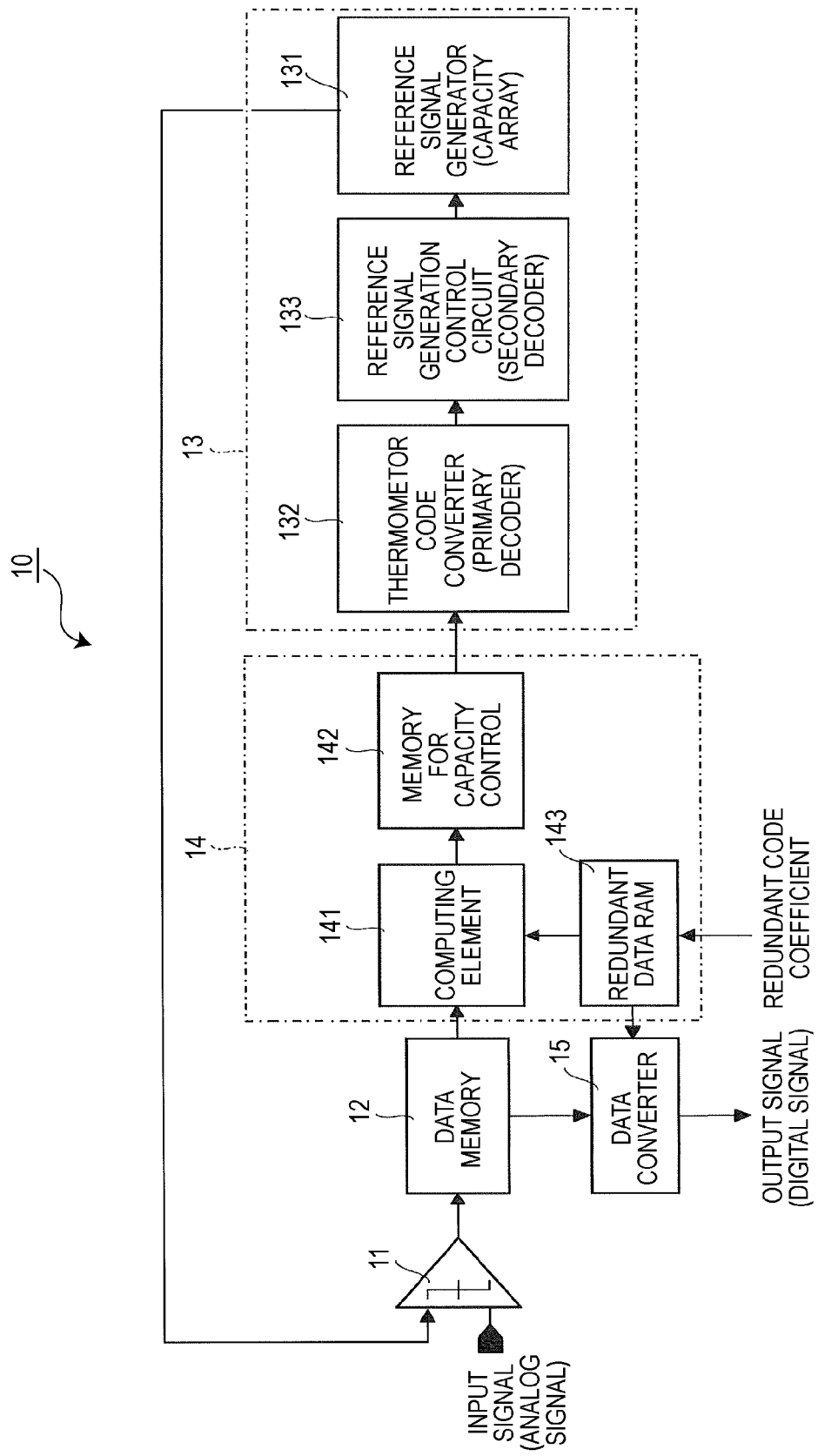
FIG. 1 is a block diagram showing a system configuration of a successive approximation type A/D converter according to an embodiment of the invention.

An embodiment of the invention will now be described in detail with reference to the drawings.
System Configuration
FIG. 1 is a block diagram showing a system configuration of a successive approximation register A/D converter according to an embodiment of the invention. As shown in FIG. 1, a successive approximation register A/D converter 10 according to the present embodiment includes a comparator 11, a data memory 12, a reference signal generating section 13, a control section 14, and a data converter 15.

The comparator 11 successively compares an analog signal, which is an input signal, with reference signals supplied from the reference signal generating section 13. The data memory 12 serves as a latch circuit, and results of the comparison at the comparator 11 are stored in the memory. The reference signal generating section 13 is, for example, a D-A converter, and the section generates reference signals to be successively compared with an analog signal at the comparator 11 under the control of the control section 14. Details of the reference signal generating section 13 will be described later.

The control section 14 controls the reference signal generating section 13 generating the reference signals based on the results of comparison at the comparator 11 stored in the data memory 12, and the section also controls oversampling based on instructions from outside. Details of the control section 14 will be described later. N-bit digital data are finally stored in the data memory 12 as results of successive approximations at the comparator 11. The data converter 15 performs conversion for eliminating redundancy and correction calculations based on the number of times oversampling is performed before outputting the A/D converted digital data stored in the data memory 12. Thus, an N-bit digital signal is finally output.

Details of the reference signal generating section 13 and the control section 14 will now be described. First, the reference signal generating section 13 will be described.
(Reference Signal Generating Section)

In the reference signal generating section 13, errors can occur due to variations of the characteristics of the D-A converter forming a part of the reference signal generating section 13. Such errors fluctuate the reference signals as noises. Variations of the D-A converter characteristics can be suppressed using a method as described below.

For example, a dynamic element matching method may be used, in which elements associated with 1 LSB (Least Significant Bit) to form a part of the D-A converter are prepared in a quantity required to achieve a certain resolution and in which an element is (pseudo-) randomly selected each time A/D conversion is performed. When such a dynamic element matching method is used, errors can be averaged and suppressed through oversampling.

Examples of implementation of the dynamic element matching method are described in Reference Document 1 in which a reference signal is an electric current and Reference Document 2 in which a reference signal is a voltage.
Reference Document 1: T. Miki, et al., "An 80-NHz 8 bit CMOS D/A Converter", IEEE Journal of Solid-State Circuits, vol. sc-21, No. 6, December 1986
Reference Document 2: G. I. Radulov, et al., "A Binary-To-Thermometer Decoder with Built-in Redundancy for Improved DAC Yield", Circuits and Systems, ISCAS 2006, proc.

As shown in FIG. 1, the reference signal generating section 13 includes a reference signal generator 131, a thermometer code converter 132 serving as a primary decoder, and a reference signal generation control circuit 133 serving as a secondary decoder. A specific configuration of the reference signal generating section 13 will be described below.

The reference signal generating section 13 will now be specifically described by referring to an example in which a reference signal is a voltage.

Figure 2:
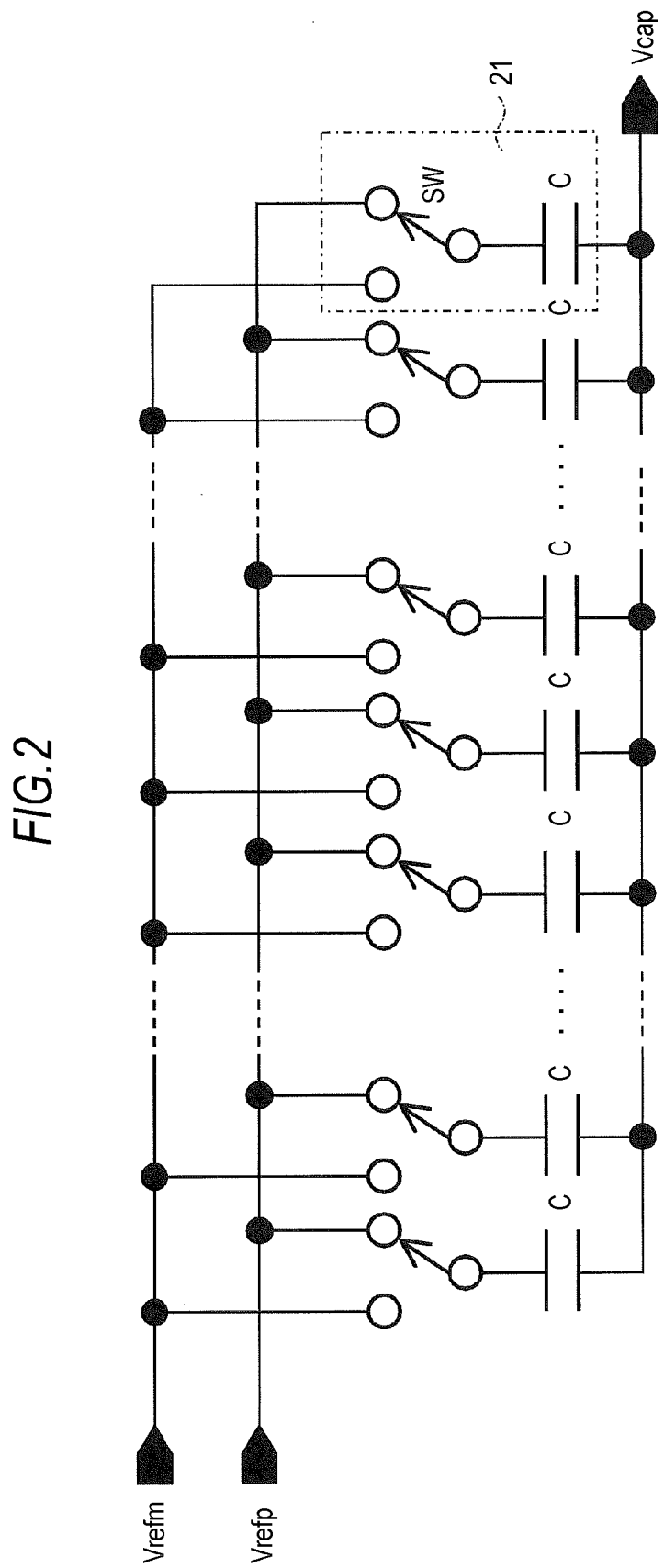
FIG. 2 is a circuit diagram showing an exemplary configuration of a reference signal generating section.

When a reference signal is a voltage, the reference signal generator 131 is formed by a plurality of unit capacities C. Specifically, the plurality of unit capacities C are commonly connected at one end thereof, and a positive reference voltage Vrefp or a negative reference voltage Vrefn is selectively applied through a switch SW to another end of each unit capacitor, as shown in FIG. 2.

Figure 3B:
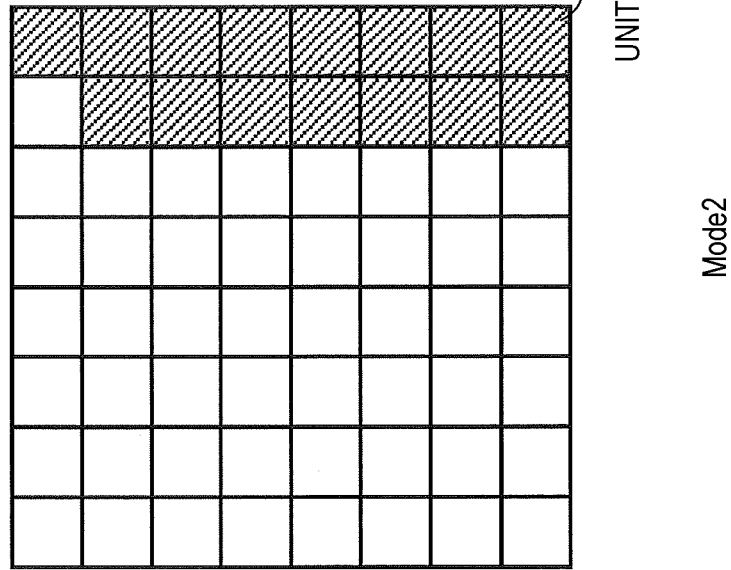
FIGS. 3A and 3B show examples of modes for selecting 15 unit capacities C from among 64 unit capacities C at random.
Figure 3A:
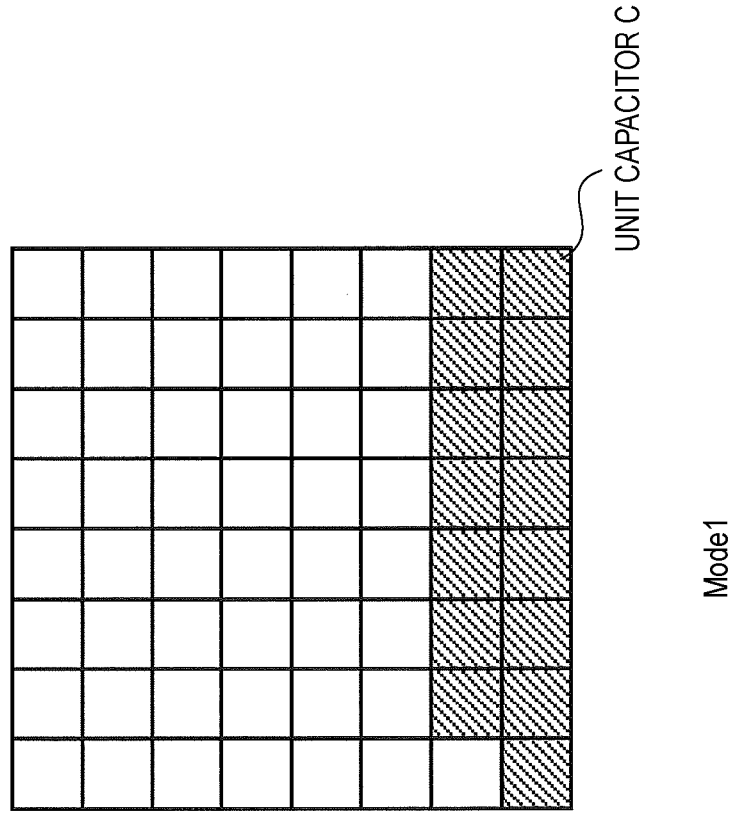

Cells 21 each including a unit capacitor C and a switch SW are disposed in the form of a two-dimensional array in a quantity required to achieve a certain resolution. For example, let us assume that there are 64 unit capacities C and that 15 unit capacities C among the 64 unit capacities 64 are selected at random. Possible modes for such selection include a mode as shown in FIG. 3A for selecting 15 unit capacities C located at the bottom of the array of 64 unit capacities C and a mode as shown in FIG. 3B for selecting 15 unit capacities C located on the right side of the array. The hatched parts of FIGS. 3A and 3B represent unit capacities (cells) which have been selected. The modes shown in FIGS. 3A and 3B will be hereinafter referred to as "Mode 1" and "Mode 2", respectively.

Figure 4:
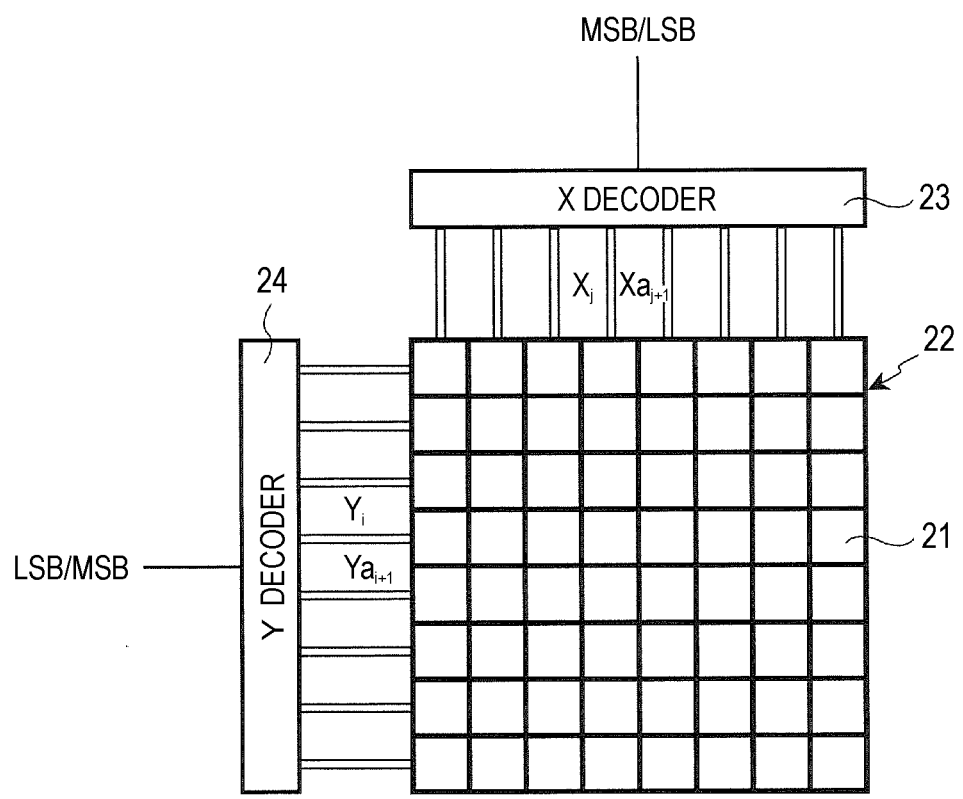
FIG. 4 is a block diagram showing an exemplary configuration of a unit capacitor selection circuit.

FIG. 4 is a block diagram showing an exemplary configuration of a unit capacitor selection circuit used when the number of the unit capacities C is 64.

In FIG. 4, a capacitor array portion 22 is formed by disposing cells 21 each including a unit capacitor C and a switch SW in the form of a two-dimensional array. The capacitor array portion 22 corresponds to the reference signal generating section 131 shown in FIG. 1. An X decoder 23 and a Y decoder 24 are disposed around the capacitor array portion 22. The X decoder 23 and the Y decoder 24 are primary decoders which perform primary conversion, i.e., conversion of a binary code into a thermometer code. That is, the X decoder 23 and the Y decoder 24 correspond to the thermometer code converter 132 shown in FIG. 1.

Figure 5:
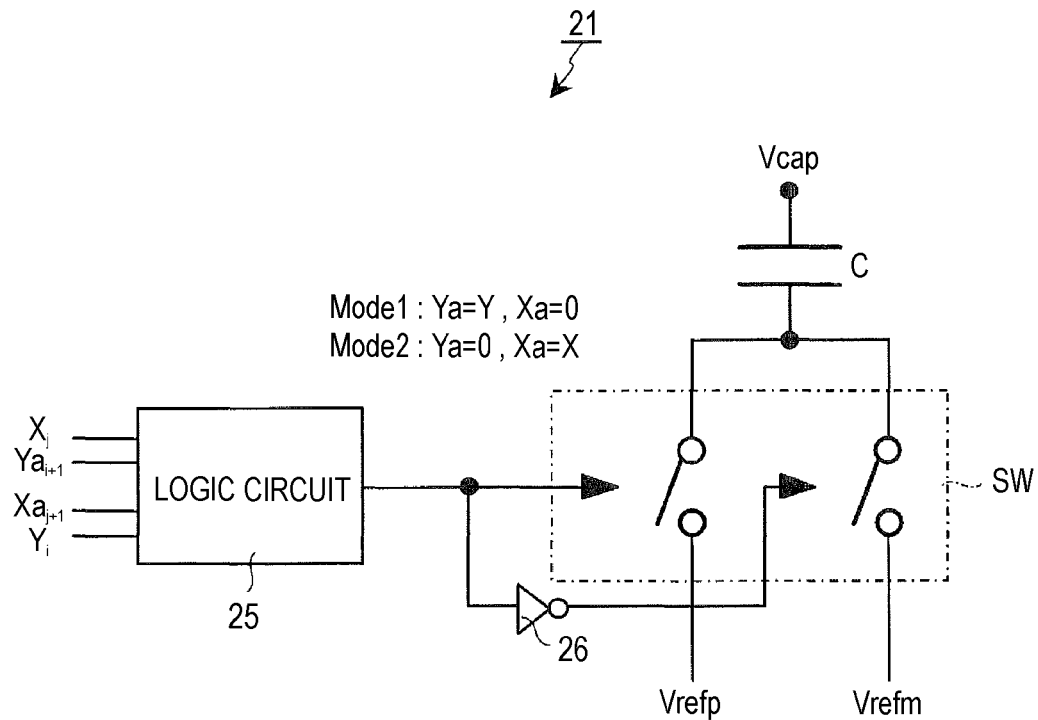
FIG. 5 is a circuit diagram showing an example of an internal configuration of a cell.

FIG. 5 shows an exemplary configuration of a cell 21 including a unit capacitor C and a switch SW. As shown in FIG. 5, the cell 21 includes a logic circuit 25 and an inverter 26 in addition to the unit capacitor C and the switch SW. The logic circuit 25 serves as a secondary decoder as will be described later. That is, the logic circuit 25 corresponds to the reference signal generation control circuit 133 shown in FIG. 1.

Decode results $X_j$ and $Xa_{j+1}$ are input to the logic circuit 25 from the X decoder 23, and decode results $Y_i$ and $Ya_{i+1}$ are input to the circuit from the Y decoder 24. An output of the logic circuit 25 is directly supplied to the switch SW, and another output of the circuit, which is inverted by the inverter 26, is also supplied to the switch SW.

Figure 6A:
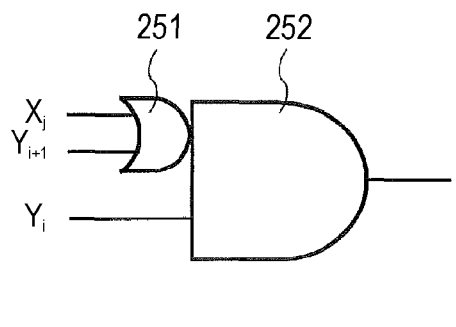
FIGS. 6A and 6B are circuit diagrams showing exemplary configurations of a logic circuit.
Figure 6B:
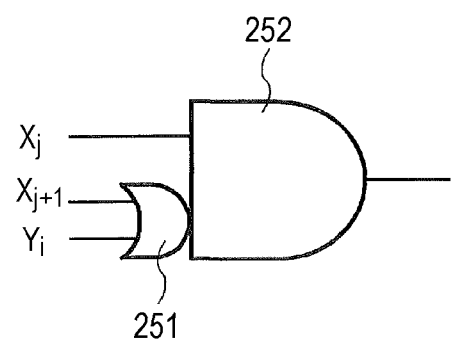

FIGS. 6A and 6B show exemplary configurations of the logic circuit 25. The logic circuit 25 includes an OR circuit 251 and an AND circuit 252. In Mode 1 (FIG. 6A), the OR circuit 251 carries out logical OR between decode results $X_j$ and $Y_{i+1}$. The AND circuit 252 carries out logical AND between the result of the logical OR at the OR circuit 251 and the decode result $Y_i$. As a result, the AND circuit 252 provides logical AND results "Ya=Y" and "Xa=0" in Mode 1 (FIG. 6A).

In Mode 2 (FIG. 6B), the OR circuit 251 carries out logical OR between decode results $X_{j+1}$ and $Y_i$. The AND circuit 252 carries out logical AND between the result of the logical OR at the OR circuit 251 and the decode result $X_j$. As a result, the AND circuit 252 provides logical AND results "Ya=0" and "Xa=X" in Mode 2 (FIG. 6B).

As apparent from the above description, the unit capacitor selection circuit for selecting a unit capacitor C is formed by the thermometer code converter 132 serving as a primary decoder and the reference signal generation control circuit 133 serving as a secondary decoder.

Operations of the unit capacitor selection circuit having the above-described configuration will now be described. Since the number of cells in the capacitor array portion 22 is 64, for example, a 6-bit signal is used as a signal for selecting a cell 21.

First, three upper bits or MSBs and three lower bits or LSBs are input to the X decoder 23 and the Y decoder 24 to select a cell 21. Each of the input signals representing upper bits or MSBs and lower bits or LSBs is converted from a 3-bit binary code into an 8-bit thermometer code (primary conversion) at the X decoder 23 and the Y decoder 24. When LSBs are input to the X decoder 23 and MSBs are input to the Y decoder 24, the selection mode is Mode 1. When MSBs are input to the X decoder 23 and LSBs are input to the Y decoder 24, the selection mode is Mode 2 (see FIGS. 3A and 3B).

For example, when 15 LSBs are input as an input signal to select 15 out of the 64 unit capacities C, three upper bits 001 are input in the Y direction, and three lower bits 111 are input in the X direction. At this time, the selection mode is Mode 1. In Mode 1, the upper bits (001) are converted into 00000011 by the Y decoder 24, and the lower bits (111) are converted into 01111111. The unit capacities C selected in this case are 15 capacities located at the bottom as shown in FIG. 3A among the 64 unit capacities C disposed in the form of a two-dimensional array.

In Mode 2, the upper bits are converted into 00000011, and the lower bits are converted into 01111111. The unit capacities C selected in Mode 2 are 15 capacities located on the right side as shown in FIG. 3B among the 64 unit capacities C disposed in the form of a two-dimensional array. Signals thus output in Modes 1 and 2 are averaged (oversampled) to allow any error attributable to variation of the capacity values of the unit capacities C to be corrected.

Although the embodiment is described as having two modes for selection, i.e., Modes 1 and 2, the invention is not limited to the two modes, and any type of capacitor selection pattern can be designed by changing the circuit configuration. Further, the number of cells is not limited to 64.

(Control Section)

The control section 14 will now be described. As shown in FIG. 1, the control section 14 includes a computing element 141, a memory 142 for capacitor control, and a redundant data RAM 143.

The computing element 141 calculates a bit string to be used as the next reference signal from the result of a comparison at the comparator 11 stored in the data memory 12 and redundant data supplied from the redundant data RAM 143. The result of the calculation at the computing element 141 or the bit string to be used as the next reference signal is stored in the memory 142 for capacitor control. The above-described thermometer code converter 132 converts the result of the calculation at the computing element 141 stored in the memory 142 for capacitor control into a thermometer code. Externally writable redundant data are stored in the redundant data RAM 143 in advance.

(Sample-and-Hold Circuit)

As apparent from FIG. 1, the successive approximation register A/D converter 10 according to the present embodiment has no sample-and-hold circuit on a side thereof where an input signal terminal of the comparator 11 is provided.

A common successive approximation register A/D converter necessarily has a sample-and-hold circuit on a side thereof where an input signal terminal is provided. The reason is that a successive approximation register A/D converter cannot perform an A/D conversion process accurately when the signal level of an input signal fluctuates during A/D conversion.

On the contrary, the successive approximation register A/D converter 10 according to the present embodiment has no sample-and-hold circuit on a side thereof where an input signal terminal is provided and therefore performs successive approximation without performing a sample-and-hold operation on the input signal. Since no sample-and-hold operation is performed, when a change occurs in the input signal during comparison, there is a concern about an error which may be caused by the change.

However, when the successive approximation register A/D converter 10 has an operating speed sufficiently higher than the rate of a change in the input signal (the operating speed exceeding the rate by a predetermined amount or more) or when the input signal remains a constant voltage until the end of the A/D conversion process, the A/D conversion can be carried out accurately without a sample-and-hold operation. In such cases, the input signal may be a voltage from a DC power supply which outputs a DC signal for a long time or a pixel output signal from a solid-state imaging device which can output a DC signal for an arbitrary time under control exercised from outside.

As thus described, the exclusion of a sample-and-hold circuit makes the embodiment more advantageous than a common A/D converter having a sample-and-hold circuit constituted by a capacitor C in that no kT/C noise attributable to a capacitor C fluctuate an input signal. Further, since a capacitor C used in a sample-and-hold circuit occupies a large area, the elimination of a sample-and-hold circuit allows the successive approximation register A/D converter 10 to be provided with a small size and a simple circuit configuration.

(Oversampling Operation)

An oversampling operation performed by the successive approximation register A/D converter 10 according to the present embodiment having the above-described configuration will now be described. The description will be made on an assumption that oversampling is performed M times.

First, a common successive approximation register A/D converter will be described. In a common successive approximation type A/D converter, a reference signal generating section 13 first outputs a voltage as a reference signal, the voltage having an amplitude that is one half of a maximum amplitude (full scale; FS). Then, the section outputs a voltage FS/4 or 3FS/4 which is higher or lower than the first voltage by amplitude that is one half of the amplitude of the first voltage, i.e., amplitude equivalent to ¼FS. Successive approximation is subsequently carried out by generating reference signals, e.g., a signal higher or lower than the second signal by amplitude that is one half of the amplitude of the second signal, i.e., amplitude (⅛)FS and a signal higher or lower than the third signal by amplitude that is one half of the amplitude of the third signal, i.e., amplitude (1/16)FS. The oversampling operation is to execute an A/D conversion process plural times, the conversion process involving a step to be performed N times. Thus, plural pieces of digital data are obtained.

On the contrary, the successive approximation register A/D converter 10 according to the present embodiment is controlled as described below to perform the oversampling operation in a short time. At the first A/D conversion process, successive approximation is carried out on an input analog signal to obtain a digital value of N bits. The A/D conversion process performed at this time is a common A/D conversion process involving successive approximation as described above at which A/D conversion is performed by repeating a step N times.

Then, oversampling is carried out at the second and subsequent A/D conversion processes. When there is a high degree of correlation between the states of the analog signal when input for the first A/D conversion process and when input for the second and subsequent A/D conversion processes (when there is no change in the analog signal), there is no difference between n bits on the upper side. From this point of view, A/D conversion is started in the middle of the bit string at the second and subsequent A/D conversion processes or oversampling processes.

Specifically, at the second and subsequent A/D conversion processes, the upper n bits of the digital value of N bits obtained by the first A/D conversion process are not subjected to A/D conversion or fixed as they are, and A/D conversion is carried out on lower bits starting with the (N−n)-th bit. That is, the oversampling operation is carried out by repeating A/D conversion of the lower bits starting with the (N−n)-th bit M times. The number n of upper bits having unchanging digital values becomes greater to allow A/D conversion at the second and subsequent A/D conversion processes to be started at a lower bit, the higher the degree of correlation between the states of the analog signal when input for the first A/D conversion process and when input for the second and subsequent processes.

As thus described, at the second and subsequent A/D conversion processes or oversampling processes, A/D conversion is started in the middle of the bit string, and there is no need for processing the part from most significant bit up to the bit immediately preceding the bit at which A/D conversion is started. Therefore, the processing time can be reduced accordingly. Let us assume that the processing time reduced per cycle of A/D conversion is represented by T. Then, a reduction of T×M can be achieved in the processing time of the entire oversampling processes. That is, processing time required to perform oversampling M times can be made shorter by the amount of time of T×M than that required where this control method is not employed. Thus, a reduction in A/D conversion time can be achieved.

By way of example, FIG. 7 is a timing chart for an instance in which a return value of 2 bits is set to cause a return to the lower bit in the second position from the end. The return value of 2 bits means that the second and subsequent A/D conversion processes are carried out by returning to the second LSB. Signals obtained through oversampling are integrated (averaged) to suppress noise components such as random noises included in the input signal, and an improved signal-to-noise ratio can therefore be achieved.

Let us discuss about A/D conversion of 10 bits (N=10) by way of example. One A/D conversion process using successive approximation is normally completed over 10 clocks (by executing a step 10 times or 10 cycles). When the A/D conversion process is performed for the first time, the process takes a processing time equivalent to 10 clocks, whereas each of the second and subsequent A/D conversion processes takes a processing time equivalent to only about 2 clocks. Therefore, when the A/D conversion is carried out by performing averaging four times using oversampling, the process takes a conversion time of 40T according to the related art. On the contrary, when the A/D conversion is carried out according to the present embodiment, the conversion time can be reduced to 16T or 0.4 in terms of time ratio.

In the case of A/D conversion of 12 bits, conversion involving averaging performed four times takes a conversion time of 48T when the A/D conversion is carried out according to the related art. On the contrary, when the A/D conversion is carried out according to the present embodiment, the conversion time can be reduced to 18T or 0.375 in terms of time ratio. In the case of A/D conversion of 14 bits, conversion involving averaging performed four times takes a conversion time of 56T when the A/D conversion is carried out according to the related art. On the contrary, when the A/D conversion is carried out according to the present embodiment, the conversion time can be reduced to 20T or 0.357 in terms of time ratio.

The magnitude of the return value causing a return to the lower bit is determined by noise levels imposed on the input signal and the magnitude of 1 LSB. Let us assume that random noises have a normal distribution with a standard deviation represented by σ_r. Then, it is desirable that the return value is an LSB value equal to or greater than 6σ_r. For example, when 1 LSB=σ_r, it is desirable that the return value is equal to or greater than 6 LSBs. Then, a return equivalent to three bits (8 LSBs) is desirable.

Figure 8:
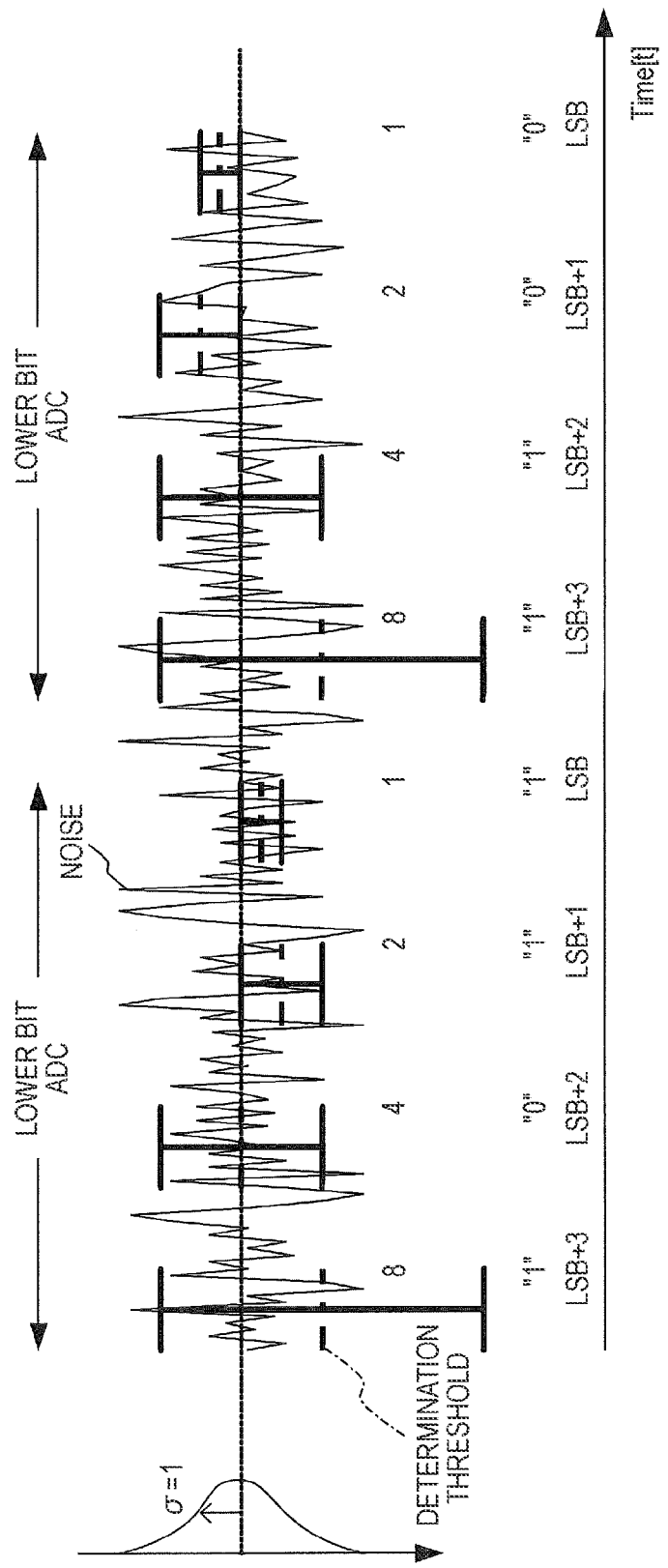
FIG. 8 is a waveform diagram showing an operation waveform of an A/D converter having a return value of 3 bits.

By way of example, FIG. 8 shows an operation waveform of an A/D converter having a return value of 3 bits. Obviously, noise levels σ depend on the performance of the semiconductors carried by the converter. Determination thresholds shown in FIG. 8 correspond to reference signals generated by the reference signal generating section 13 to be used as references for comparisons at the comparator 11.

In a successive approximation register A/D converter, when an input signal resides in the neighborhood of a determination threshold (determination level) for successive approximation, a mistake of comparator decision may be caused by the influence of disturbance such as a noise. In order to suppress such mistakes of comparator decision, in the successive approximation register A/D converter 10 according to the present embodiment, redundancy is imparted to the reference signal generating section 131 constituted by a capacitor array.

Specifically, after a mistake of comparator decision occurs, the determination threshold is relaxed by a predetermined value (for example, the threshold is raised by a predetermined value) under control exercised by the control section 14 to impart redundancy to the reference signal generating section 131. The resistance of the converter to mistakes of comparator decision can be improved by imparting redundancy to the reference signal generating section 131 as thus described.

Figure 9A:
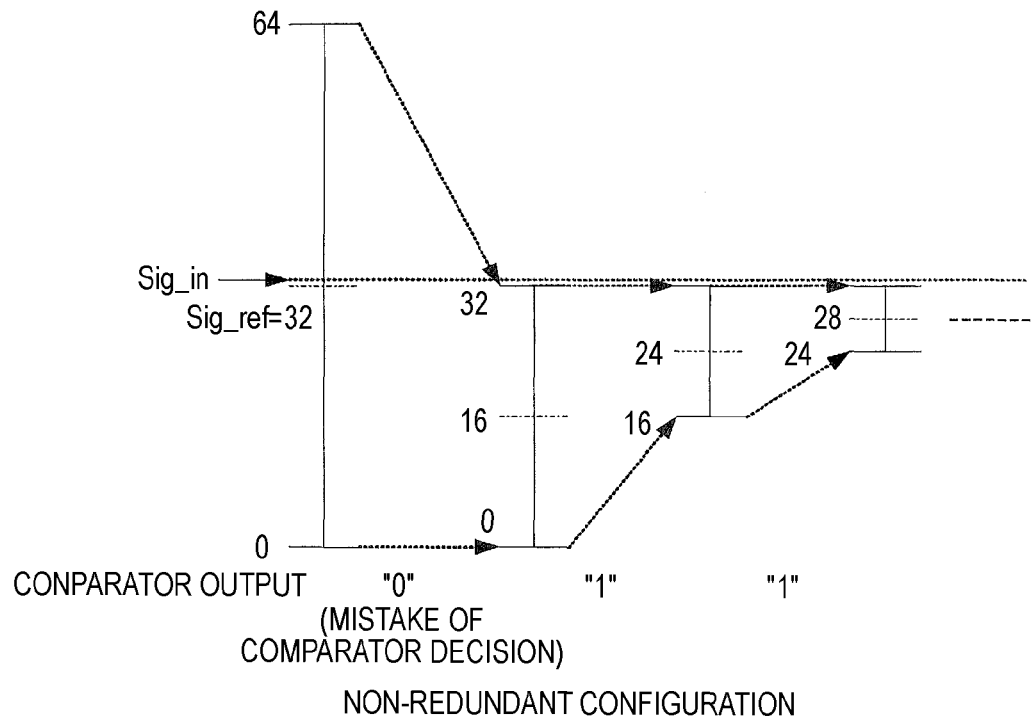
FIGS. 9A and 9B are waveform diagrams showing transitions between reference voltages observed in a non-redundant configuration (FIG. 9A) and a redundant configuration (FIG. 9B) when an input signal is mistakenly decided in the neighborhood of FS/2.
Figure 9B:
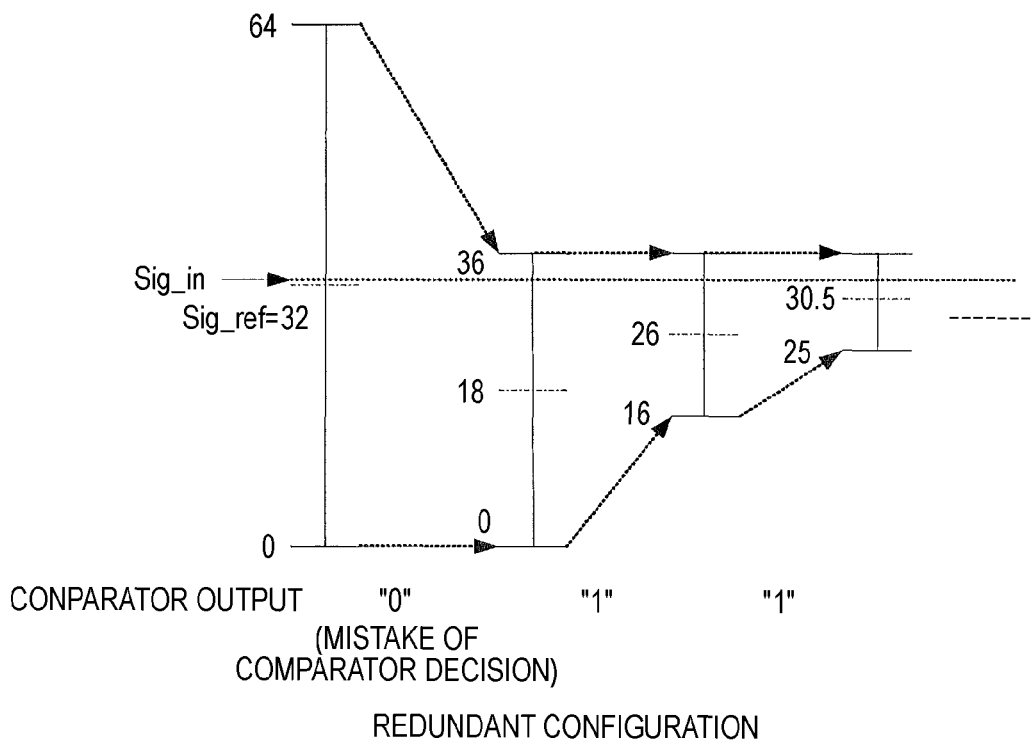

FIGS. 9A and 9B show transitions between reference voltages observed in a configuration having no redundancy (9A) and a configuration having redundancy (9B), respectively, when a mistake of comparator decision of an input signal occurs in the neighborhood of a voltage FS/2. For instance, the illustrated examples employ a maximum amplitude or full scale voltage of 64 LSBs and a degree of redundancy of 12.7%.

When a redundant configuration is not employed (FIG. 9A), comparisons for A/D conversion are carried out using determination thresholds having different magnitudes FS/2, FS/4, FS/8, and so on. In this case, when the input signal is mistakenly decided by the comparator due to the influence of disturbance or the like, A/D conversion carried out after the mistake of comparator decision will provide erroneous data, and the signal will not be recovered.

When a redundant configuration is employed (FIG. 9B), comparisons for A/D conversion are carried out using determination thresholds having magnitudes FS/2, FS/4+Red1, (FS/4+Red1)/2+Red2, and so on. "Red1" and "Red2" represent values (predetermined values) used to raise a determination threshold. The use of a redundant configuration is advantageous compared to the instance involving no redundant configuration (FIG. 9A) as follows. Even when a signal is mistakenly decided by the comparator at the first stage or an intermediate stage of A/D conversion under the influence of disturbance or the like, the redundant configuration allows the data to be recovered from outputs provided by the comparator at subsequent cycles of determination.

In the above-described embodiment, oversampling is performed with upper n bits fixed at all of the second and subsequent A/D conversion processes. However, the embodiment merely represents a preferred example, and the invention is not limited to the same. Specifically, the upper n bits may alternatively be fixed at one of the second and subsequent A/D conversion processes at least. In this way, the A/D conversion can be carried out with a conversion time shorter than in the case wherein the control method of the embodiment is not employed.

The above-described embodiment is on an assumption that the comparator 11 has no sample-and-hold circuit on the side thereof where an input signal terminal is provided. However, it is not intended to limit the invention to applications of the same to successive approximation register A/D converters having no sample-and-hold circuit. That is, the invention may be applied to successive approximation register A/D converters having a sample-and-hold circuit. However, the use of a configuration without a sample-and-hold circuit is advantageous in that a kT/C noise attributable to a capacitor C will not fluctuate an input signal and in that a simpler circuit configuration can be employed, as described above.

Solid-State Imaging Device

Figure 10:
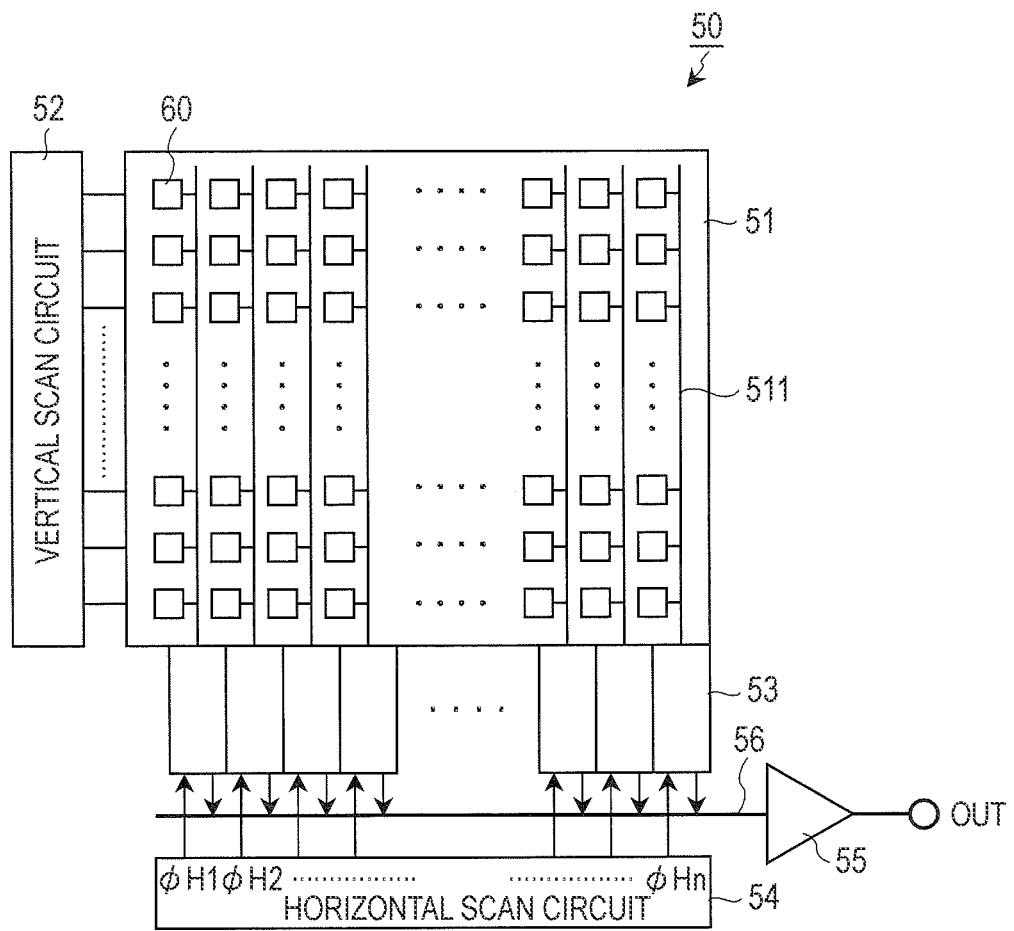
FIG. 10 is a system configuration diagram showing an exemplary configuration of a CMOS image sensor employing the invention.

FIG. 10 is a system configuration diagram showing an exemplary configuration of a solid-state imaging device employing the invention, e.g., a CMOS image sensor.

As shown in FIG. 10, a CMOS image sensor 50 according to the present embodiment includes a pixel array section 51 formed by two-dimensionally arranging unit pixels (which may be hereinafter simply referred to as "pixels") 60 each including a photoelectric conversion element in the form of a matrix and peripheral circuits associated with the section.

The peripheral circuits associated with the pixel array section 51 include, for example, a vertical scan circuit 52, column circuits 53, a horizontal scan circuit 54, and an output circuit 55. For example, those circuits are integrated on the same chip (semiconductor substrate) on which the pixel array section 51 is provided.

Figure 11:
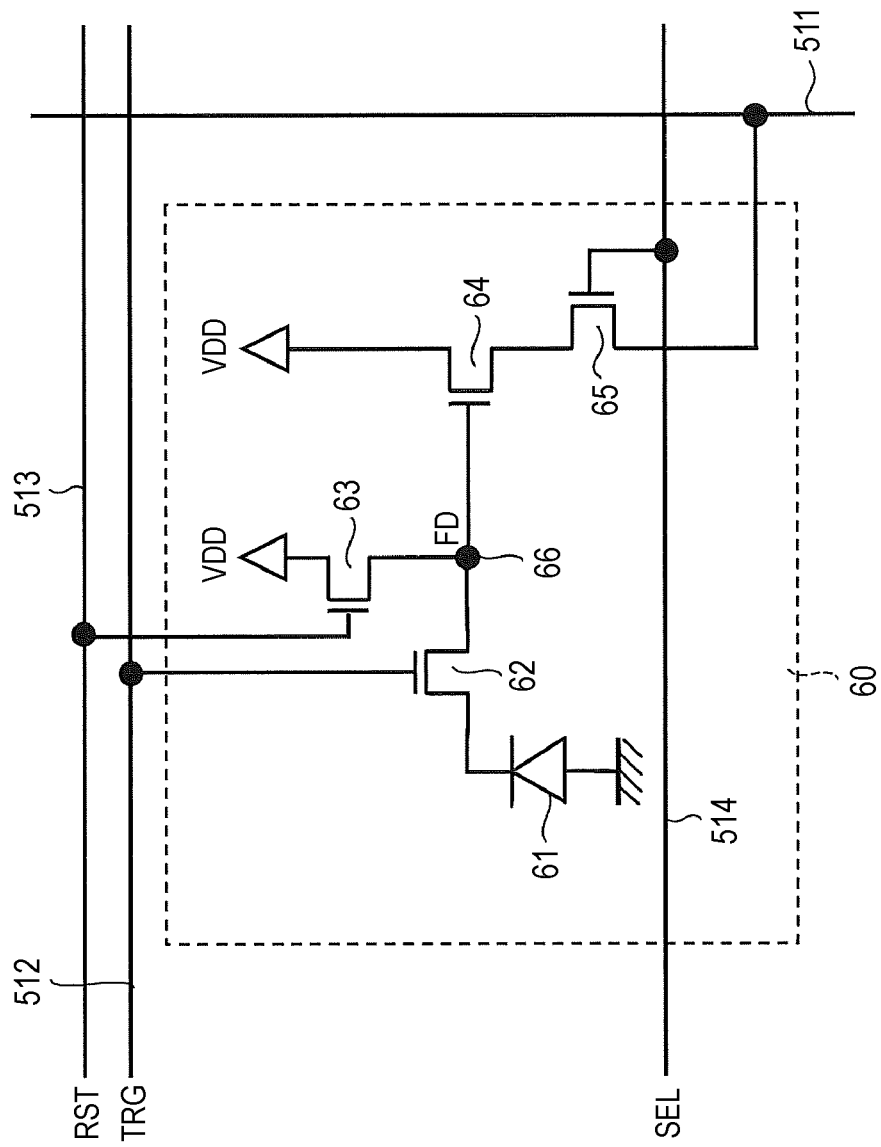
FIG. 11 is a circuit diagram showing an example of a circuit configuration of a unit pixel.

The matrix-like pixel array of the pixel array section 51 is accompanied by a vertical signal line 511 provided in association with each column of pixels and drive control lines provided in association with each row of pixels, e.g., a transfer control line 512, a reset control line 513, and a selection control line 514 (see FIG. 11).

The vertical scan circuit 52 is constituted by a shift register, an address decoder, or the like. The vertical scan circuit 52 has a configuration including a readout scan system and a sweep-out scan system, although the configuration is not specifically shown. The readout scan system sequentially selects and scans unit pixels to read signals from them, the pixels being scanned row-by-row.

The sweep-out scan system carries out a sweep-out scan to sweep out (reset) unnecessary electrical charges from the photo-electric conversion elements at the unit pixels on a row to be subjected to a readout scan performed by the readout scan system, the sweep-out scan preceding the readout scan by an amount of time equivalent to the shutter speed of the sensor. Unnecessary electrical charges are swept out (reset) by the sweep-out scan system as thus described to enable what is called an electronic shutter operation. An electronic shutter operation is an operation of newly starting exposure of a photoelectric conversion element (starting accumulation of photoelectric charges) after discharging photoelectric charges existing in the element.

A signal read out by a readout operation of the readout scan system corresponds to the quantity of light which has impinged on the device after the immediately preceding readout operation or electronic shutter operation. The period between the readout timing of the immediately preceding readout operation or the sweep-out timing of the immediately preceding electronic shutter operation and the readout timing of the present readout operation is a time (exposure time) for accumulating photoelectric charges at the unit pixels.

A signal output from each unit pixel of a row of pixels selectively scanned by the vertical scan circuit 52 is supplied to a column circuit 53 via the respective vertical signal line 511. A column circuit 53 is a signal readout circuit section provided in association with each pixel column of the pixel array section 51 and having an A/D converter for converting an analog signal output from each pixel 60 of a selected row into a digital signal. A successive approximation register A/D converter according to the embodiment as described above may be used as such an A/D converter.

In addition to the A/D conversion function, the column circuits 53 may have various signal processing functions such as CDS (Correlated Double Sampling). The CDS process is a noise reduction process for reducing noises having fixed patterns unique to pixels such as reset noises and variations of a threshold of amplification transistors.

Although a column circuit 53 is provided for each unit column of the pixel array of the pixel array section 51 in this embodiment, one column circuit 53 may alternatively be provided for a plurality of columns such that the one circuit will be used for the plurality of columns on a time-division basis.

The horizontal scan circuit 54 is constituted by a shift register, an address decoder, or the like, and the circuit sequentially outputs horizontal selection pulses φH1 to φHn to sequentially select the column circuits 53 provided for the respective pixel columns of the pixel array section 51. As a result of a selective scan performed by the horizontal scan circuit 54, pixel signals converted into a digital form by the column circuits 53 are sequentially read out onto the horizontal signal line 56.

The output circuit 55 performs various type of signal processing on the pixel signals transmitted thereto by the horizontal signal line 56. For example, the signals are subjected to processes such as black level adjustment, correction of variation between columns, and color-related processes at the output circuit 55. The circuit may alternatively perform only a buffering process.

Timing signals and control signals to serve as references for operations of the vertical scan circuit 52, the column circuits 53, the horizontal scan circuit 54, and the output circuit 55 are generated by a timing control circuit (timing generator) which is not shown.

Pixel Circuit

FIG. 11 is a circuit diagram showing an example of a circuit configuration of a unit pixel 60. As shown in FIG. 11, the unit pixel 60 in this exemplary circuit includes a photoelectric conversion element, e.g., a photodiode 61 and four transistors, e.g., a transfer transistor 62, a reset transistor 63, an amplification transistor 64, and a selection transistor 65.

In this example, N-channel MOS transistors are used as the four transistors 62 to 65. The combination of the transfer transistor 62, the reset transistor 63, the amplification transistor 64, and the selection transistor 65 and the conductivity type of the transistors are merely an example, and the invention is not limited to such a combination of transistors.

The photodiode 61 is connected to a negative power supply (e.g., ground) at an anode electrode thereof, and it photoelectrically converts received light into a photoelectric charge (photoelectrons in this case) having a charge amount corresponding to the quantity of the light. The cathode of the photodiode 61 is electrically connected to a gate electrode of the amplification transistor 64 through the transfer transistor 62. A node 66 electrically connected to a gate electrode of the amplification transistor 64 is called an FD (floating diffusion).

The transfer transistor 62 is connected between a cathode electrode of the photodiode 61 and the FD section 66. A transfer pulse TRG which is active at a high level, e.g., a level VDD (such a pulse will hereinafter be described as "high active") is supplied to a gate electrode of the transfer transistor 62 through a transfer control line 512. As a result, the transfer transistor 62 is turned on to transfer the photoelectric charge obtained by the photoelectric conversion at the photodiode 61 to the FD section 66.

The reset transistor 63 is connected to a pixel power supply VDD and the FD section 66 at a drain electrode and a source electrode thereof, respectively. A high active reset pulse RST is supplied to a gate electrode of the reset transistor 63 through a reset control line 513. As a result, the reset transistor 63 is turned on to reset the FD section 66 by discharging the electrical charge at the FD section 66 to the pixel power supply VDD before the signal charge is transferred from the photodiode 61 to the FD section 66.

The amplification transistor 64 is connected to the FD section 66 and the pixel power supply VDD at a gate electrode and a drain electrode thereof, respectively. The amplification transistor 64 outputs electrical potential existing at the FD section 66 after the section is reset by the reset transistor 63 as a reset signal (reset level) Vreset. The amplification transistor 64 also outputs electrical potential existing at the FD section 66 after the signal charge is transferred thereto by transfer transistor 62 as a light accumulation signal (signal level) Vsig.

For example, the selection transistor 65 is connected to a source electrode of the amplification transistor 64 at a drain electrode thereof and connected to a vertical signal line 511 at a source electrode thereof. A high active selection pulse SEL is supplied to a gate electrode of the selection transistor 65 through a selection control line 514. As a result, the selection transistor 65 is turned on to put the unit pixel 60 in a selected state and to relay the signal output by the amplification transistor 64 to the vertical signal line 511.

An alternative circuit configuration may be employed, in which the selection transistor 65 is connected between the pixel power supply VDD and the drain of the amplification transistor 64.

The unit pixels 60 are not limited to the above-described pixel configuration formed by four transistors. For example, the amplification transistor 64 and the selection transistor 65 may be combined to provide a pixel configuration including three transistors, and there is no special limitation on the configuration of the resultant pixel circuit.

In the CMOS image sensor 50 having A/D converters serving as column circuits 53 as described above, successive approximation register A/D converters are used as the A/D converters to achieve a high signal-to-noise ration by averaging plural pieces of image data in an overlapping relationship through oversampling. Specifically, since a plurality of consecutively formed images have a high level of correlation with each other, noise components included in pixel signals can be reduced by averaging the data of the plurality of images, and a high signal-to-noise ratio can therefore be achieved. In addition, the use of successive approximation register A/D converter according to the embodiment as described above allows the conversion time of A/D conversion to be reduced, and signal processing can therefore be performed at a higher speed.

Although the above embodiment is an example of application of the invention to a CMOS image sensor 50 having A/D converters provided at column circuits 53, the CMOS image sensor may alternatively have A/D converters provided at an output circuit 55. Alternatively, the CMOS image sensor may have A/D converters provided outside the chip carrying the sensor.

Although the above embodiment is an example of application of the invention to a CMOS image sensor having unit pixels, disposed in the form of a matrix, for detecting signal charges as physical quantities corresponding to quantities of visible light, the invention is not limited to applications to CMOS image sensors. That is, the invention may be applied to solid-state imaging devices including A/D converters in general.

Further, the invention is not limited to solid-state imaging devices in which pixels at a pixel array section are sequentially scanned row-by-row to read out a signal from each pixel of a selected row. The invention may be also applied to X-Y address type solid-state imaging devices in which pixels are arbitrarily selected on a pixel-by-pixel basis to read out signals from the selected pixels on a pixel-by-pixel basis.

Such a solid-state imaging device may be formed as a single chip, and the device may alternatively be in the form of a module having an imaging function obtained by integrating an imaging section and a signal processing section or an optical system into a package.

The invention is not limited to applications to solid-state imaging devices, and it may be applied to imaging apparatus. Imaging apparatus in this context include camera systems such as digital still cameras and video cameras and electronic apparatus having an imaging function such as portable telephones. A module as described above, i.e., a camera module, incorporated in an electronic apparatus may be referred to as "imaging apparatus".

Imaging Apparatus

Figure 12:
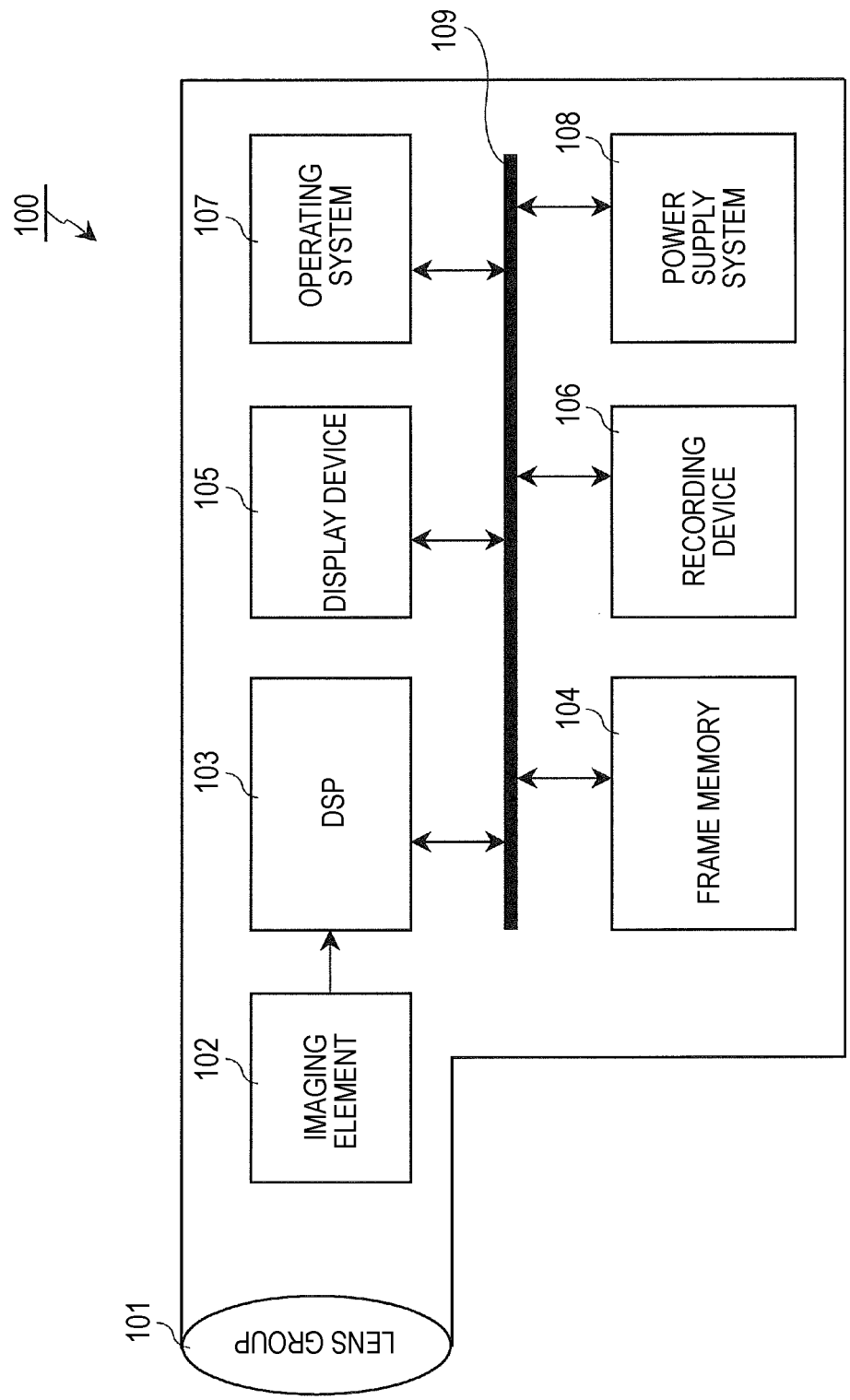
FIG. 12 is a block diagram showing an exemplary configuration of an imaging device according to an embodiment of the invention.
Figure 13:
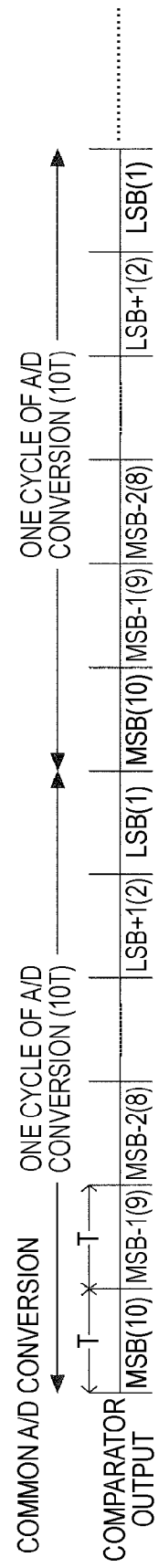
FIG. 13 is a diagram showing a processing sequence of a common successive approximation type A/D converter.

FIG. 12 is a block diagram showing an example of a configuration of an imaging apparatus according to the embodiment of the invention. As shown in FIG. 12, an imaging apparatus 100 according to the embodiment of the invention has an optical system including a lens group 101, an imaging element 102, a DSP circuit 103 serving as a camera signal processing circuit, a frame memory 104, a display device 105, a recording device 106, an operating system 107, and a power supply system 108. The DSP circuit 103, the frame memory 104, the display device 105, the recording device 106, the operating system 107, and the power supply system 108 are connected to each other through a bus line 109.

The lens group 101 takes in incident light (image light) from an object and forms an image of the same on an imaging surface of the imaging element 102. The imaging element 102 converts the quantity of the incident light imaged on the imaging surface by the lens group 101 into electrical signals on a pixel-by-pixel basis and outputs the signals as pixel signals. A CMOS image sensor having successive approximation register A/D converters according to the above described embodiment is used as the imaging element 102.

The display device 105 is a panel type display device such as a liquid crystal display or an organic EL (electro-luminescence) display device, and it displays a motion picture or a still image imaged by the imaging element 102. The recording device 106 records the motion picture or still image imaged by the imaging element 102 in a recording medium such as a video tape or a DVD (digital versatile disk).

The operating system 107 is operated by a user to output operational commands associated with various functions of the imaging apparatus. The power supply system 108 supplies various levels of electric power to operate the DSP circuit 103, the frame memory 104, the display device 105, the recording device 106, and the operating system 107 as occasion demands.

It should be understood by those skilled in the art that various modifications, combinations, sub-combinations and alterations may occur depending on design requirements and other factors insofar as they are within the scope of the appended claims or the equivalents thereof.

What is claimed is:

1. An A/D converter comprising:
a reference signal generating section that generates a reference signal;
a comparator that compares an analog signal input thereto with the reference signal and converts the analog signal into a digital signal;
a data memory in which the digital signal resulting from the comparison is stored;
a control section that controls the generation of the reference signal to perform oversampling by executing an A/D conversion process on the analog signal at the comparator plural times, the A/D conversion process comprising a first A/D conversion process and a second and subsequent A/D conversion processes, and the A/D conversion process executes such that the analog signal is A/D-converted into a digital value of N bits and an upper bit value of n of the N-bit digital value is provided at the first A/D conversion process and such that the second and subsequent A/D conversion processes are performed starting with only a lower bit of the (N−n)-th or lower order with the upper n bits of the N-bit digital value obtained at the first A/D conversion process fixed; and
a data converter in communication with the data memory and that generates a digital output signal based on the digital signal stored therein,
wherein the reference signal generating section has a redundant configuration.

2. The A/D converter of claim 1, wherein the redundant configuration includes relaxing a determination threshold by a predetermined value.

3. The A/D converter of claim 1, wherein the reference signal generating section having the redundant configuration is constituted by a capacitor array.

4. A solid-state imaging device comprising a successive approximation type A/D converter converting an analog signal output from a pixel including a photoelectric conversion element into a digital signal, wherein the successive approximation type A/D converter includes:
a reference signal generating section that generates a reference signal;
a comparator that compares an analog signal input thereto with the reference signal and converts the analog signal into a digital signal;
a data memory in which the digital signal resulting from the comparison is stored;
a control section that controls the generation of the reference signal to perform oversampling by executing an A/D conversion process on the analog signal at the comparator plural times, the A/D conversion process comprising a first A/D conversion process and a second and subsequent A/D conversion processes, and the A/D conversion process executes such that the analog signal is A/D-converted into a digital value of N bits and an upper bit value of n of the N-bit digital value is provided at the first A/D conversion process and such that the second and subsequent A/D conversion processes are performed starting with only a lower bit of the (N−n)-th or lower order with the upper n bits of the N-bit digital value obtained at the first A/D conversion process fixed; and a data converter in communication with the data memory and that generates a digital output signal based on the digital signal stored therein, wherein the reference signal generating section has a redundant configuration.

5. The solid-state imaging device of claim 4, wherein the redundant configuration includes relaxing a determination threshold by a predetermined value.

6. The solid-state imaging device of claim 4, wherein the reference signal generating section having the redundant configuration is constituted by a capacitor array.

7. An imaging apparatus comprising: a solid-state imaging device including a successive approximation type A/D converter converting an analog signal output from a pixel including a photoelectric conversion element into a digital signal; and an optical system forming an image of incident light on an imaging surface of the solid-state imaging device, the successive approximation type A/D converter including:

a reference signal generating section that generates a reference signal;

a comparator that compares an analog signal input thereto with the reference signal and converts the analog signal into a digital signal;

a data memory in which the digital signal resulting from the comparison is stored;

a control section that controls the generation of the reference signal to perform oversampling by executing an A/D conversion process on the analog signal at the comparator plural times, the A/D conversion process comprising a first A/D conversion process and a second and subsequent A/D conversion processes, and the A/D conversion process executes such that the analog signal is A/D-converted into a digital value of N bits and an upper bit value of n of the N-bit digital value is provided at the first A/D conversion process and such that the second and subsequent A/D conversion processes are performed starting with only a lower bit of the (N−n)-th or lower order with the upper n bits of the N-bit digital value obtained at the first A/D conversion process fixed; and a data converter in communication with the data memory and that generates a digital output signal based on the digital signal stored therein, wherein the reference signal generating section has a redundant configuration.

8. The imaging apparatus of claim 7, wherein the redundant configuration includes relaxing a determination threshold by a predetermined value.

9. The imaging apparatus of claim 7, wherein the reference signal generating section having the redundant configuration is constituted by a capacitor array.

\* \* \* \* \*